United States Patent [19]

Sachs

[11] Patent Number: 4,661,200
[45] Date of Patent: Apr. 28, 1987

[54] STRING STABILIZED RIBBON GROWTH

[76] Inventor: Emanuel M. Sachs, 42 Old Middlesex Rd., Belmont, Mass. 02178

[21] Appl. No.: 109,865

[22] Filed: Jan. 7, 1980

[51] Int. Cl.[4] ................... C30B 11/02; C30B 15/34; B01D 9/00
[52] U.S. Cl. ................ 156/616 R; 156/608; 156/617 SP; 156/617 R; 156/622; 156/DIG. 64; 156/DIG. 88; 156/DIG. 84; 422/246; 422/249; 148/172; 148/173
[58] Field of Search ....... 156/608, DIG. 83, DIG. 84, 156/DIG. 88, 617 SP, 617 R, 622, DIG. 64; 422/246, 249; 148/172, 173; 65/147, 148, 99 A

[56] References Cited

U.S. PATENT DOCUMENTS 3,002,821 10/1961 Haron .................................. 156/608
3,124,489 3/1964 Vogel et al. ......................... 156/608
3,761,295 9/1973 Hulse et al. ......................... 156/608
4,028,059 6/1977 La Belle et al. .................... 156/608

FOREIGN PATENT DOCUMENTS 1039364 8/1966 United Kingdom ....... 156/DIG. 84

Primary Examiner—Gary P. Straub
Attorney, Agent, or Firm—Weingarten, Schurgin, Gagnebin & Hayes

[57] ABSTRACT

A method and apparatus for stabilizing the edge positions of a ribbon drawn from a melt includes the use of wettable strings drawn in parallel up through the melt surface, the ribbon being grown between the strings. In one embodiment, the string stabilized edge technique is utilized for pulling of the ribbon at an angle to the melt surface. String introduction techniques are also described including several in which the strings are introduced to the melt through apertures in the bottom of the crucible utilized for containing the melt. Also described is a technique for minimizing the introduction of impurities from the melt into a ribbon by constantly flowing the melt under the growth interface in a direction perpendicular to the plane of the growing ribbon.

26 Claims, 14 Drawing Figures

STRING STABILIZED RIBBON GROWTH

FIELD OF THE INVENTION

This invention relates to the continuous growth of crystalline bodies from a melt of the same material, and more particularly to string stabilized ribbon growth.

DISCUSSION OF THE PRIOR ART

One of the most important applications for crystal growing is in the area of semiconductor substrate material in which the ribbons of large grain polycrystalline or single crystal material are grown. These ribbons, usually of silicon have wide application to solar cell substrates. Several processes are described in the literature for the growth of crystalline ribbod from the melt. In one process a die is used to feed the molten material up from the melt and shape the growing ribbon, both by capillary action. In order to exercise control over this process it is necessary to control the heat removal from the ribbon surface, the pulling speed, average die temperature, and the precise temperature distribution along the entire die, most specifically at the edges. This process suffers principally from a lack of growth stability as the edge positions are difficult to control and the ribbon often "freezes" to tne die when the die temperature or other growth variable momentarily fluctuates. An additional problem encountered with this technique is that all the material flowing up the die must be incorporated into the frozen ribbon, impurities included. It is therefore not possible to take full advantage of the segregation of impurities at the interface by rejecting them back into the bulk of the melt.

U.S. Pat. No. 3,129,061 issued to S. N. Dermatis et al on Apr. 14, 1964 describes another process for ribbon growth, the web dendritic growth process. Here dendrites, which are of the same material as the ribbon, are grown into the subcooled melt at the ribbon edges in order to accomplish stabilization of the ribbon edge position. The principle problem associated with this technique is the high degree of temperature control needed to maintain dendritic growth at the ribbon edges while maintaining conventional growth along the ribbon "web". Attention is also drawn to an Article entitled Thermal Analysis of Solidification in Web-Dendritic Ribbon Growth, by Harrill, Rhodes, Faust, and Hilborn, Journal of Crystal Growth, 44 (1978) 34–44. Other web dendritic techniques are illustrated in U.S. Pat. Nos. 3,298,795 issued to Donald R. Hamilton et al on Jan. 17, 1967; 3,031,403 issued to Allan I. Bennett, Jr. on Apr. 24, 1962; and 3,370,927 issued to J. W. Faust, Jr. on Feb. 27, 1968. The latter of these patents is directed to angularly pulling continuous dendritic crystals.

In all cases of dendritic growth, edge stabilization is accomplished with dendrites which are "frozen" regions of crystalline material. It will be appreciated that the freezing of edges while maintaining an unfrozen web in-between presents a difficult control problem.

A further technique for growing a matrix structure of silicon is illustrated in an article by Theodore F. Ciszek and Guenter H. Schwuttke, entitled "Inexpensive Silicon Sheets for Solar Cells", NASA Tech Briefs, Winter 1977, pps. 432–433, in which a graphite screen is dipped into a liquid silicon bath and pulled from the bath. This produces a patterned sheet of liquid silicon films which then solidifies to produce a textured semi-crystalline composite.

It will be appreciated that the technique described by Ciszek, et al is not a crystal growing technique in the sense that silicon is first captured by capillary action and is held in the graphite matrix until such time as it solidifies. In contra-distinction, the growing of crystalline ribbons is such that crystallization takes place at the face of the melt as the ribbon is withdrawn from the melt.

The result of growing crystalline ribbon in the manner just described is that grain boundaries in general exist perpendicular to the plane of the ribbon. The Ciszek, et al structure in general produces randomly oriented grain boundaries which act as random carrier traps in the finished product, thereby making the device less uniform in performance.

Moreover, the Ciszek technique results in undesirable small grain sizes and does not result in a uniform central web which is unencumbered with electrodes or other impurity attracting rods.

What is perhaps more important is that in Ciszek, et al, the finished structure is not a flat sheet; and it is impossible to obtain a flat sheet with the Ciszek, et al system.

Finally, in Ciszek, et al, a grid imbedded in a semiconductor ribbon must be very precisely placed or else it results in shorting the p-n junction created by diffusion.

SUMMARY OF THE INVENTION

In the present invention, a ribbon with an unobstructed central web is grown directly from the melt, while the edge positions are determined and stabilized by wetted strings or strands running continuously up through the melt and frozen into the growing ribbon. These strands, unlike dendrites, are of a material different from the melt. In the preferred embodiment, these strings are wetted by the melt. In this process, called string stabilized growth (SSG), the shape defining the surface tension controlled meniscus is defined on the bottom by the melt, on the top by the interface with the growing crystal and at the edges by the wetted strings. The parameters that must be controlled in the process are pulling speed, rate of heat removal from the ribbon surface, and average melt temperature. Due to the capillary induced edge definition, it is not necessary to maintain precise control of the temperature of the melt at the ribbon edges vis-a-vis the ribbon center.

In the case of the growth of silicon ribbon, graphite or quartz strings are used.

It is a further aspect of this invention that it may be applied to growth of string stabilized ribbon at any angle to the melt from almost horizontal growth to fully vertical growth. Growth at a low angle to the melt has the primary advantage of increasing the area of the solidification interface and thereby increases the maximum possible growth speed.

Several alternative means are provided for the continuous introduction of the string to the melt. In one embodiment, a simple hole in the crucible bottom is used to introduce the string, the action of surface tension being sufficient to counteract the gravitational head, so as to keep the molten material from leaking out. In another embodiment, a small compartment below the crucible serves to balance the gravitational head of the liquid by gas pressure. A further embodiment utilizes electromagnetic forces to prevent gravitationally induced leakage at the string.

The question of the introduction of impurities from the string into the melt is addressed in two parallel regards. First, as part of the subject invention the immersion time of the string in the melt is minimized by reducing the depth of the melt through which the string must travel. Secondly, two techniques are used to freeze the molten silicon directly around the string as it enters the melt, thus freezing the impurities in. In the preferred embodiment, a current is passed along the string, across the interface between string and melt and through the melt. A peltier or thermoelectric junction is forced between the string and the melt and heat may be removed at this junction. This peltier cooling may thus be used to locally freeze the silicon to the string.

Additionally, the invention includes means of minimizing the introduction to the ribbon of whatever harmful impurities exist in the melt. First, a constant flow of melt is maintained perpendicular to the plane of the growing ribbon. This allows for convection and diffusion to carry away the impurities that are rejected at the growth interface. Secondly, a continual flushing of melt is maintained. As the concentration of impurities in the melt is significantly higher than that in the grown crystal, this serves to establish a limit on the amount of impurities available for incorporation into the crystal.

BRIEF DESCRIPTION OF THE DRAWINGS

These and other advantages of the present invention are more fully set forth below in the following detailed description and in the accompanying drawings, of which.

DETAILED DESCRIPTION

Figure 1:
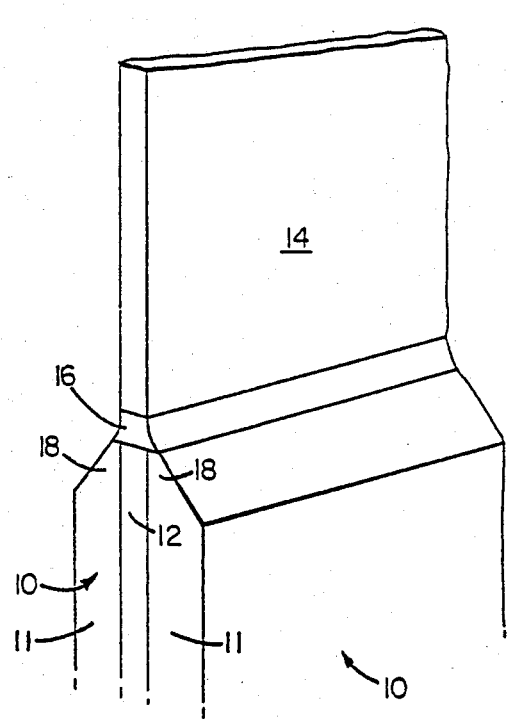
FIG. 1 is a diagrammatic illustration of a prior art ribbon growth process in which a die is used to feed molten material up from the melt.

Referring to FIG. 1, in the past, a process for the growth of crystalline ribbon from a melt may include the utilization of dies 10, separated so as to form a capillary filled slot 12 therebetween. This die is used to feed molten material up from the melt (not shown) and shape the growing ribbon 14 as it builds up at a meniscus 16 at the outlet at a face 18 of the die.

As mentioned hereinbefore, there are a number of parameters which must be controlled so that the ribbon is formed uniformly. As mentioned, one of the major difficulties with the utilization of dies is growth stability due to edge position dislocation. Moreover, impurities are not in general rejected back into the melt at the forming interface.

Figure 2:
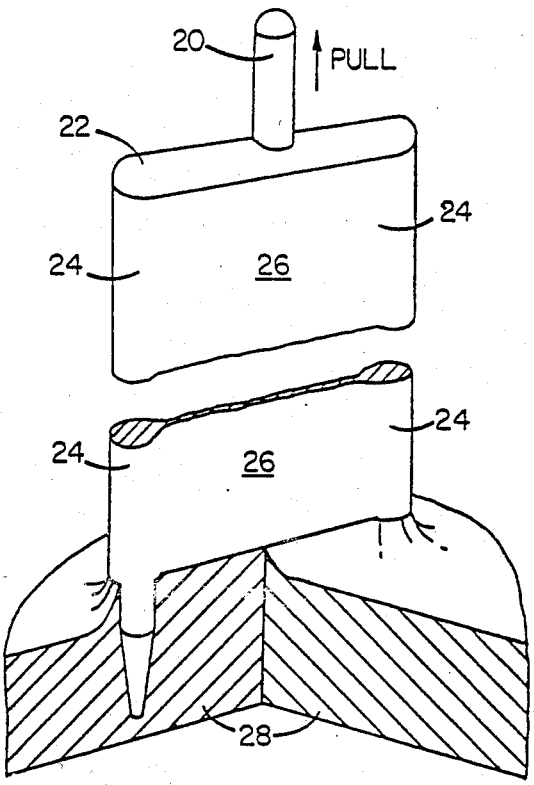
FIG. 2 is a diagrammatic illustration of the prior art web-dendritic growth process.

Referring now to FIG. 2, edge stability has been promoted in the past through the utilization of dendrites which are grown from a dendritic seed 20 which has a button 22 located transversely therebeneath. With appropriate growing conditions, edge dendrites 24 are formed with a central web 26 existing therebetween. In general growth takes place from the melt and is initiated by an oriented seed. Lateral or button growth begins when the seed is dipped into a supercooled melt here illustrated at 28 to be liquid silicon. When pulling commences the two coplanar dendrites grow downward into the melt from the ends of the button. The melt is pulled up between the dendrites by surface tension to form the web. Solidification in the web occurs above the melt surface while the dendrites grow below the surface. It will be appreciated that the growth of the dendrites requires the melt be slightly supercooled.

As mentioned hereinbefore, the principle problem associated with this technique is the high degree of temperature control needed to maintain dendritic growth at the ribbon edges while maintaining conventional growth along the ribbon web.

Figure 3:
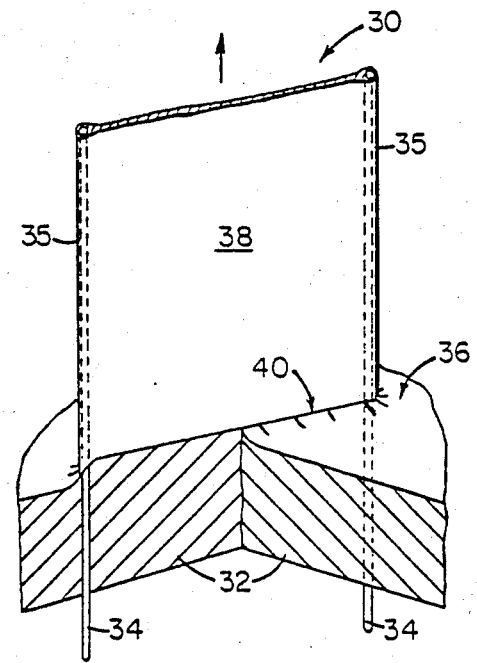
FIG. 3 is a diagrammatic illustration of one embodiment of the subject invention, in which edge definition is a result of the use of wetted strings or strands.

Referring now to FIG. 3, it will be seen that a thin, wide crystalline body 30 is being grown directly from a melt 32, of the same material. The edges of the ribbon are defined by wetted strings 34 pulled up through the melt and frozen into the growing ribbon. As will be seen, a thin film of melt 35 is frozen about strings 34. The central part of the ribbon is defined by the capillary shaping action of the meniscus 36. Here the growing ribbon or web 38 is contained between the strings and solidifies at interface 40 with the string being frozen into the ribbon. It should be noted that while FIG. 3 illustrates a case where the diameter of the string is approximately equal to the ribbon thickness, the same technique may be used to grow ribbon the thickness of which is either greater or smaller than the diameter of the string.

Figure 4:
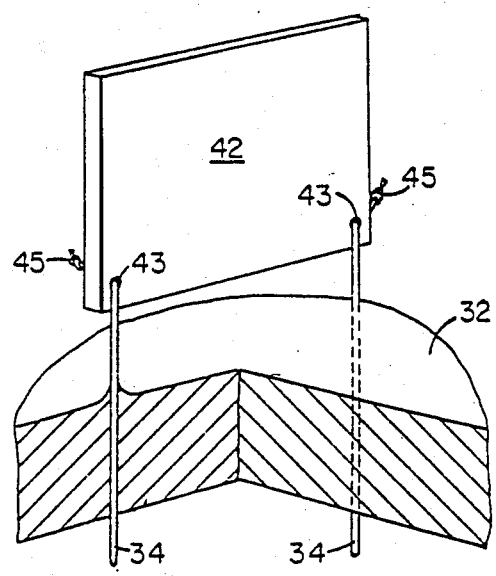
FIG. 4 is a diagrammatic illustration of the subject process illustrating start up.

FIG. 4 illustrates how the growth process is initiated. A seed 42 with strings 34 attached is lowered into melt 32, contact is made, and a meniscus is established. Growth is then initiated by pulling the strings and seed upward. Note, the seed/string unit may include a piece of previously grown ribbon.

The growth of the crystalline ribbon itself is now examined in detail. The growth of a thin sheet directly from the melt is controlled by a combination of geometrical and thermal constraints, as explained below.

The geometrical constraints are dictated by the meniscus geometry. The local radius of curvature of the meniscus along the face of the ribbon is determined by a balance of gravitationally induced pressure head and surface tension induced pressure drop across the liquid-gas interface, Laplace's equation applied at all points of the ribbon except near the edges yields:

$$R = \frac{\gamma}{\rho g h} \qquad \text{(equation 1)}$$

where R is the local radius of curvature of the meniscus in a plane perpendicular to the ribbon, $\gamma$ is the surface tension of the liquid, $\rho$ is the mass density of the liquid, g the local acceleration of gravity, and h is the elevation of the point in question above the melt surface. The meniscus must join the melt surface continuously, that is, it must have zero slope at the melt surface. In addition, the meniscus must meet the growing crystal at some specific angle, this angle determined by the properties of the material being grown. For silicon, this angle is approximately 11°.

The Laplace equation and the two boundary conditions for the meniscus may be used to find an expression for the meniscus height, e.g. elevation of the interface above the melt, required for constant thickness growth. For the vertical growth of silicon:

$$\text{Meniscus Height} = 1.09 \sqrt{\frac{\gamma}{\rho g}} \qquad \text{(equation 2)}$$

A similar expression may be found for ribbon growth of any material at any angle to the melt.

Thus, steady state, constant thickness growth requires that the meniscus establish itself at a very specific level for each growth situation. A meniscus which is higher than this value will lead to a ribbon of decreasing thickness, while a meniscus lower than this value will lead to an increasing thickness.

While the meniscus determines the rate of change of the ribbon thickness, the meniscus height itself is determined by thermal considerations primarily. It may be seen that an instantaneously valid energy balance must be maintained at the interface between heat conduction up the meniscus from the melt, heat of fusion generated by the solidifying crystal at the interface and heat conducted up and through the ribbon from the interface. The heat conducted up the meniscus depends on the temperature of the melt and the meniscus height. The heat of fusion generated depends primarily on the ribbon thickness and the growth speed, while the heat conducted up and through the ribbon depends on the ribbon thickness and the nature of the heat removal from the ribbon surface. Thus, it may be seen that the requirement of an instantaneous energy balance at the interface defines a fairly complex relationship between all relevant growth variables. This relationship, in combination with the geometrical considerations discussed earlier, dictates the physics of the growth of ribbon from the melt.

The process may be shown to be stable for essentially all configurations. In steady state growth, the geometrical requirement fixes the meniscus height and hence, the heat flux up the meniscus for a given melt temperature. Hence, the steady state ribbon thickness is principally fixed by an interaction of the heat of fusion generated at the interface with the heat conducted up and through the ribbon. In other words, the system reacts in a stable manner to adjust the thickness of the ribbon being grown until the proper heat balance is attained. This discussion applies to both vertical growth of a ribbon, as well as growth at an angle to the melt.

The width of the ribbon is of course defined by the capillary attachment to the edge stabilizing strings. This surface tension attachment will provide for a large latitude of allowed temperatures at the ribbon edges, as the edge position is no longer determined primarily by thermal effects. The strings also contribute greatly to the stability of the ribbon when produced at angles to the vertical.

Figure 5A:
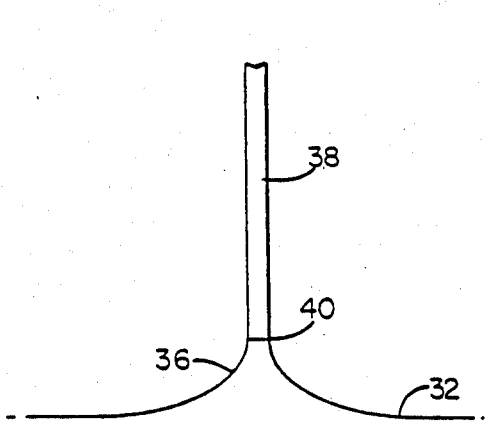
FIGS. 5A–5D illustrate crystal growth at angles to the vertical, for string supported systems.
Figure 5B:
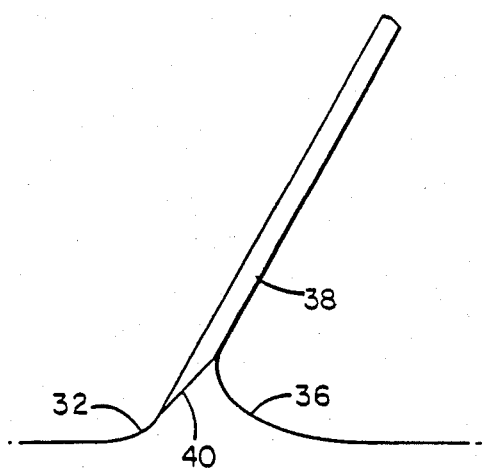
Figure 5C:
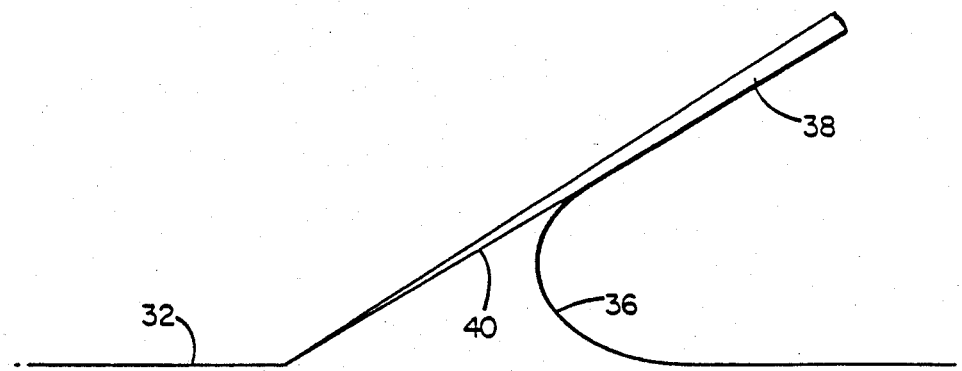
Figure 5D:
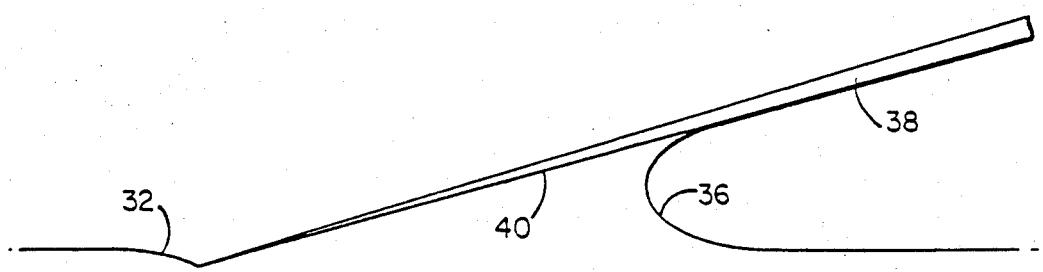

FIGS. 5A through 5D show cross sectional views of ribbon grown at various angles to the melt. These approximately scale drawings are for a material with an angle of attachment of the meniscus to the solid ($\phi_o$) of 30°. FIG. 5A shows vertical growth from the melt, FIG. 5B shows growth at 60° from the horizontal, FIG. 5C shows growth at 30° from the horizontal, and FIG. 5D shows growth at 15° from the horizontal.

These figures serve to illustrate how the boundary conditions of meniscus attachment to the growing crystal may be met while growing at any angle to the melt in steady state growth. It should be noted that while the interfaces in FIGS. 5A through 5D are shown as straight lines, they need not be straight at all. In fact, they may assume any shape, concave up, concave down, etc., as dictated by the thermal conditions. The end points of the interface are where the triple junctions of solid, liquid and gas exist. Geometrically, the distance between these end points, in combination with the angle of growth from the melt, determines the steady state ribbon thickness being grown.

It will be appreciated that the subject string edge stabilization technique greatly enhances the ability to grow ribbon at any angle to the melt. The main advantage of pulling at an angle is increased growth speed due to increased interface area.

INTRODUCTION OF THE STRING TO THE MELT

Figure 6:
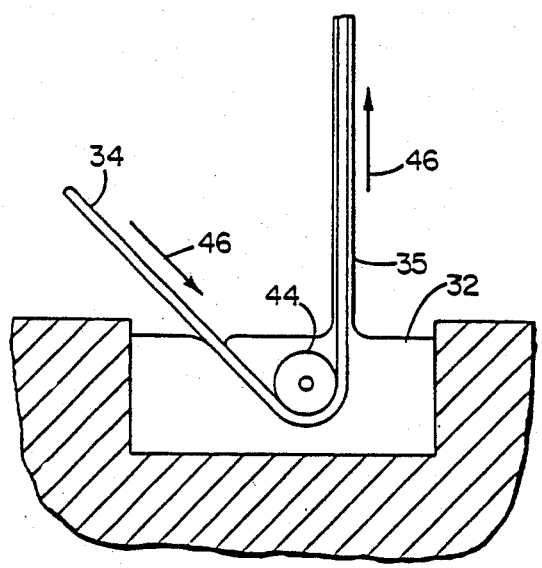
FIG. 6 is a sectional illustration showing one method of string introduction in which a pulley or like direction changing device is located within the melt.

FIGS. 6 through 9 illustrate methods of introducing the edge stabilizing string to the melt. In FIG. 6 the string 34 is passed around a pulley 44 which is totally submerged in melt 32. The string enters the melt, passes around the pulley and then emerges from the melt where it is incorporated into the growing ribbon, in the direction illustrated by arrows 46.

Figure 7:
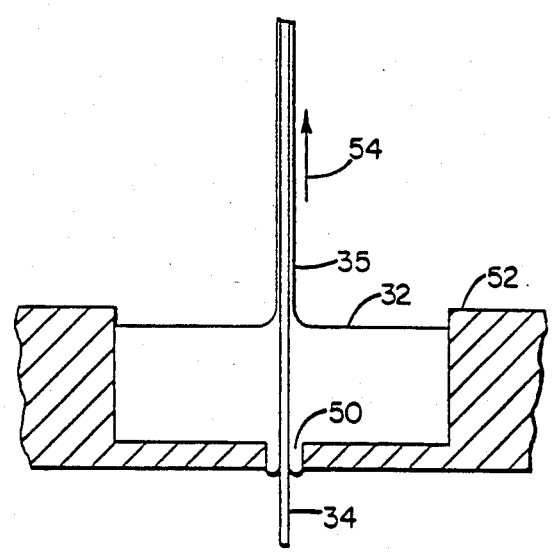
FIG. 7 is a sectional illustration showing another method of string introduction in which the string is introduced into the melt through a hole in the bottom of the melt crucible, with melt containment via surface tension.

In FIG. 7 a simple hole 50 in the bottom of a crucible 52 accommodates the string. The gravitational pressure head of the molten material is counteracted by surface tension of the same material attached to both the crucible and the string moving upwardly as illustrated by arrow 54.

Figure 8:
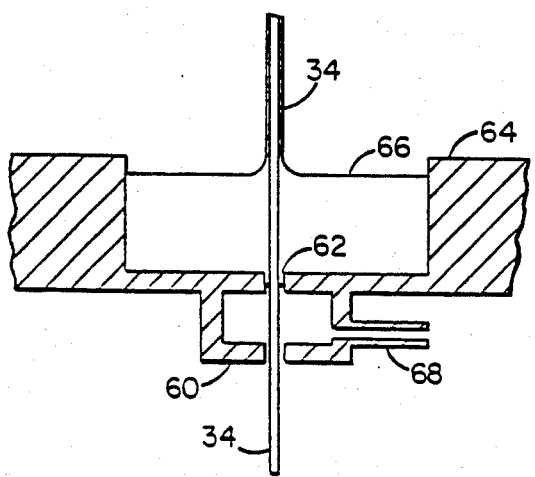
FIG. 8 is a sectional illustration of string feed and melt containment utilizing a pressurized chamber to counteract gravitational force.

In another embodiment, as illustrated in FIG. 8, a small chamber 60 is created immediately below an entrance hole 62 in a crucible 64. This chamber is then pressurized with gas so as to counteract the gravitational head of melt 66 in the crucible. Note that chamber 60 has a gas inlet channel 68 which communicates therewith.

Figure 9:
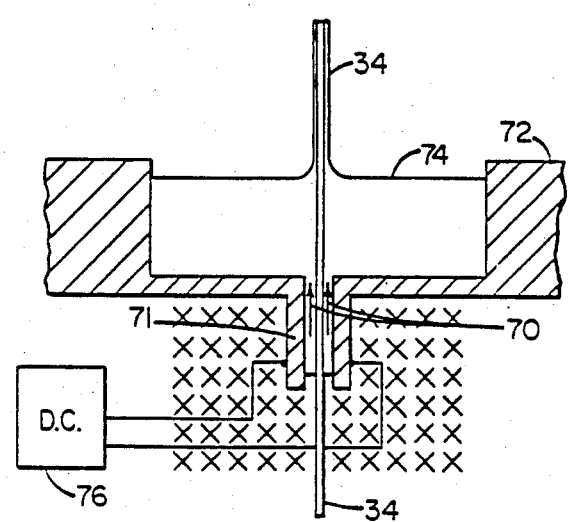
FIG. 9 is a sectional illustration of string feed and melt containment utilizing electromagnetic forces to counteract gravitational flow.

In a still further embodiment, FIG. 9, electromagnetic forces are induced in the molten material which counteracts the gravitationally induced pressure. These forces act in the direction of arrows 70. In this method, a magnetic field is created perpendicular to a guide channel 71 of a crucible 72 as illustrated by the "Xs". A current generated by the connection of a DC source 76 across string guide channel 71, is then passed through the melt in this area in a direction perpendicular to both the axis of the guide channel and the applied magnetic field. The result is an electromagnetic force induced directly in the melt, directed upward. This technique is used with materials that are electrical conductors when molten and where crucibles offer some resistivity so that current will flow transverse to the channel. The magnetic field may be applied by current loops, and the field may be introduced indirectly through the crucible.

REDUCTION OF STRING CARRIED IMPURITIES

It will be appreciated that any string, no matter how well purified, will carry with it some impurities. As the string passes through the melt, these impurities will be allowed to enter the melt and cause its contamination.

Two techniques may be used simultaneously to reduce the level of such impurity introduction. First, the residence time of the string within the melt is minimized by making the melt depth as small as possible. However, it will be appreciated that no matter how short the residence time, some impurities will enter the melt from the string. This may be avoided by freezing a layer of melt to the string as it enters the melt.

In one embodiment, the string is cooled before it enters the melt, thus freezing the melt to it on contact. In one method, the string is cooled by passing cooled gas over it as it enters the melt. However, it will be appreciated that after a small amount of time, the string will warm up to the melt temperature, and the newly frozen material will melt.

Figure 10:
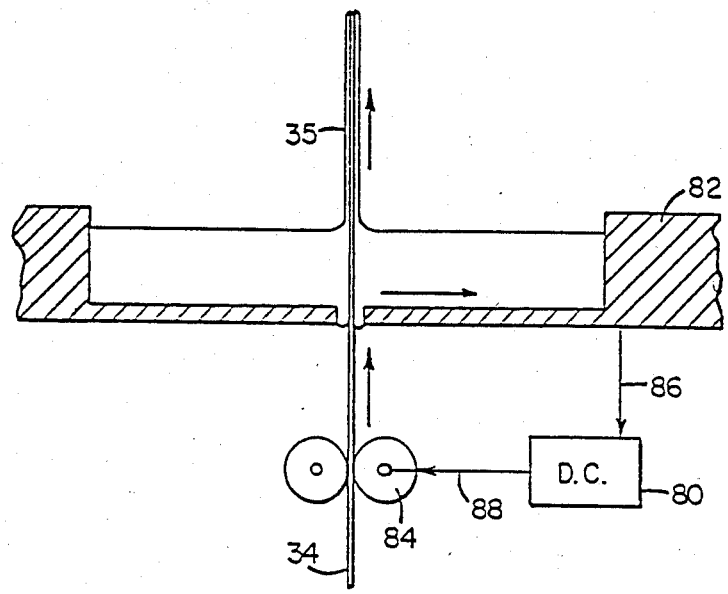
FIG. 10 is a sectional illustration of thermoelectric melt freezing through the passing of current through the string/melt interface, resulting in impurity trapping at the string.

In one embodiment, a thermoelectric effect between the string and the melt is used to freeze the silicon around the string. In this technique, as illustrated in FIG. 10, a current is passed along the string 34 in the region below the melt. This current is generated at a DC source connected between crucible 82 and string 34 at conductive rollers 84 via lines 86 and 88. The current then passes through the junction between the string and the melt, through the melt and then back out, for example, through the crucible itself. It will be appreciated that any two dissimilar conductors will have between them a relative peltier coefficient, a measure of the thermoelectric potential. If a current is forced to pass across such a junction, heat is either evolved or withdrawn at the junction, depending on the direction of current flow. In the case of silicon and graphite, graphite may be doped (e.g. with boron) so as to have a significant peltier coefficient with respect to silicon. Thus, the peltier effect may be used to withdraw a small amount of heat directly from the string melt interface. If the current is properly sized relative to the melt temperature and thermal conductivity, the peltier effect will cause a small amount of material to quickly freeze around the string as it enters the melt, thus sealing in the impurities.

In practice, both techniques, cooling the string and peltier cooling, may be used. However, it should be noted that the current passed along the string will cause a certain amount of Joule heating.

SEGREGATION OF IMPURITIES INTO THE MELT

Figure 11:
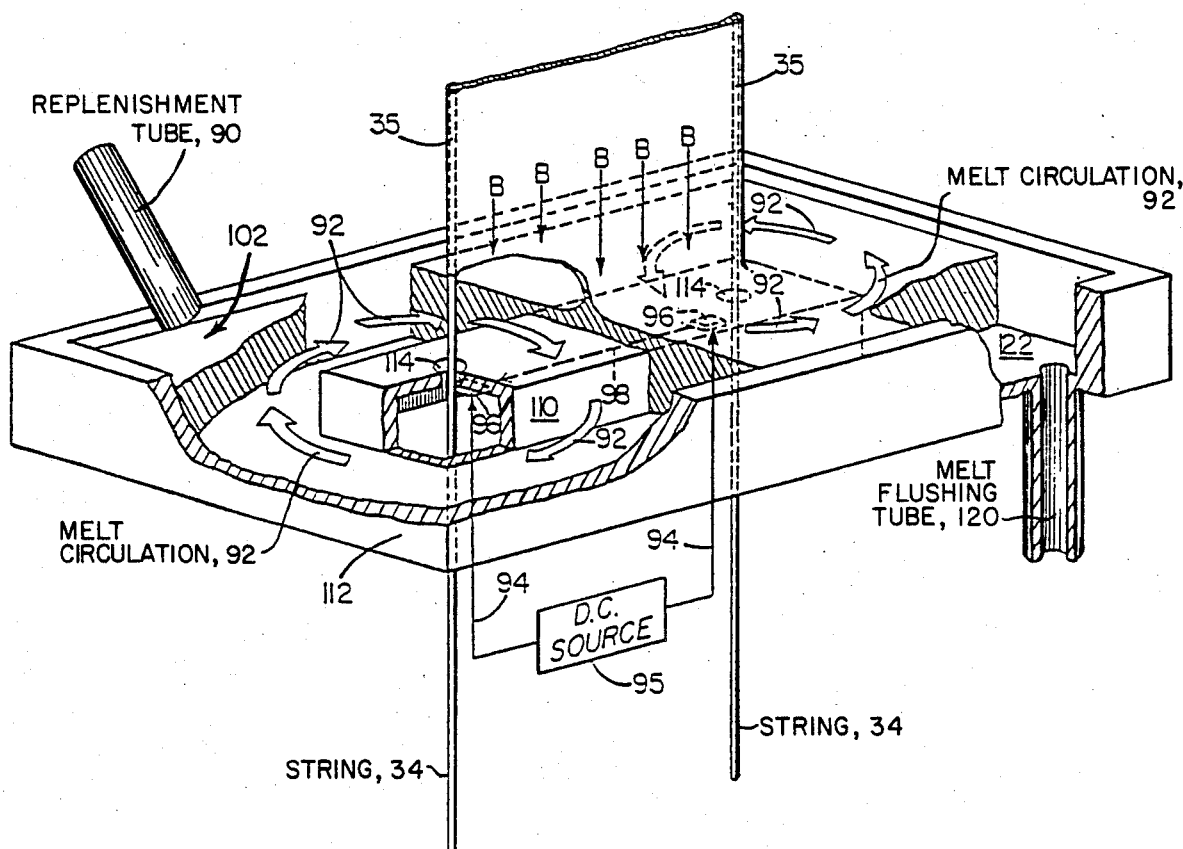
FIG. 11 is a diagrammatic illustration of impurity control with electromagnetic stirring along with melt flushing.

Referring now to FIG. 11, whenever solidification takes place at a well defined interface, a phenomenon known as impurity segregation takes place. Because of considerations of chemical equilibrium, only a certain fraction of the impurities in the melt may be incorporated into the solid, the remainder being rejected at the interface. This segregation is used to advantage in almost all crystal growth processes in order to purify the material being grown.

In order to maximize the beneficial effects of impurity segregation, it is necessary to maintain a flow of melt by the interface in order to carry away the rejected impurities. Thus, it is part of the present invention to maintain a flow melt under the growing ribbon, substantially perpendicular to the plane of the ribbon.

However, segregation of impurities into the melt is not sufficient to insure significant purification of the material in a continuous growth process. This is because, in a continuous growth process using replenishment of the melt, the impurities rejected at the growth interface continually build up in the melt. As the level of impurities in the melt builds up, the amount of impurities incorporated into the ribbon also increases.

In the present invention, this problem is solved by maintaining a constant flush of the melt. The functioning of this technique may be explained as follows:

Considering an impurity for which the segregation coefficient is 0.001, one part of a thousand of the impurities arriving at the interface is incorporated into the crystal. Assuming that the raw material has 10 parts per million (ppm) impurity level, if the melt is composed only of such material, as will be the case initially, one would expect to grow a crystal of 0.01 ppm impurity level. However, as time goes on the impurities accumulate in the melt and eventually, the crystal will have 10 ppm of impurity. At this point, the melt will actually have 10,000 ppm of impurity. However, if one continually dumps 1/10th of the melt, in steady state the melt will have approximately 100 ppm of impurity and the crystal will have 0.1 ppm of impurity. Thus, a high degree of purification is maintained even in the steady state.

FIG. 11 illustrates the continual replenishment, circulation and flushing of the melt. Melt depth reduction means for minimizing string residence time is also illustrated. The replenishment system is indicated schematically as a tube 90 through which small bits of raw material are dropped into the melt. The circulation of the melt under the growth interface is accomplished by substantially circular motion of the melt, one circulation eddy on either side of the ribbon midline as illustrated by dotted arrows 92. In the case of an electrically conducting melt, this circulation can be accomplished by induced electromagnetic forces in the liquid melt. For example, if the crucible were made of graphite and the melt were of silicon, leads 94 can be attached from a DC source 95 to the crucible bottom near the ribbon edges near the entrance holes for the stabilization strings at contacts 96. The substantially higher electrical conductivity of the liquid silicon than the graphite causes the majority of the current to flow through the liquid silicon as illustrated by dotted arrow 98. A magnetic field as illustrated by arrows B is simultaneously applied perpendicular to melt surface 102, such that the induced forces in the melt causes it to circulate in approximately the manner indicated. This magnetic field may be applied by external magnets or, more conveniently, by the field induced by the current passing through the main furnace heater.

In order to reduce the impurity level by reduction in melt depth, a barrier 110 is disposed in crucible 112, with the barrier having holes 114, through which strings 34 pass. Note the barrier may be hollow as illustrated.

Finally, the melt dumping means are indicated as a simple tube 120 projecting down from the crucible bottom 122. Dumping may be controlled through the selective sealing available through induced electromagnetic forces as described previously, in the case of the introduction of the string through the crucible bottom. Alternatively, the tube may be sealed by keeping the tip at a temperature slightly below the melting temperature of the material being grown. A slight application of heat to the tip by means of a small resistance heater or the like, would suffice to thaw the material in the tip and allow it to flow out of the crucible.

The invention is not to be limited by what has been particularly shown and described except as indicated in the appended claims.

What is claimed is:

1. A method of continuously growing crystalline or semicrystalline ribbonlike bodies from a melt of the same material wherein the ribbonlike body has a thin flat unobstructed elongate center section grown directly from the melt surface comprising; the steps of:
   drawing the ribbonlike body from the surface of the melt; and
   stabilizing the edge positions of the ribbonlike body with strings positioned along the edges thereof, which strings are frozen into the growing ribbon.

2. The method of claim 1 wherein said!strings are of a material different from that of the melt.

3. The method of claim 1 wherein the strings travel through the melt at substantially the same speed as the growth rate of the ribbon.

4. The method of claim 1 wherein the strings act to define the edges of the meniscus during ribbon growth.

5. The method of claim 1 wherein the strings are wetted by the melt.

6. The method of claim 1 wherein the ribbon is pulled in a direction perpendicular to the melt surface.

7. The method of claim 1 wherein the ribbon is pulled at an angle to the melt other than perpendicular.

8. The method of claim 1 wherein the melt is silicon and wherein the strings are selected from the group consisting of graphite, carbon and quartz.

9. The method of claim 1 wherein the melt is confined in an open top crucible, and wherein strings are introduced into the melt through its upper surface and are fed around a submerged pulley and emerge from the melt at the upper surface.

10. The method of claim 1 wherein the melt is confined in a crucible having holes in the bottom thereof and wherein the strings are introduced to the melt through the holes, with surface tension forces acting to maintain the melt from leaking out.

11. The method of claim 1 wherein the melt is confined in a crucible having holes in the bottom thereof, wherein the strings are introduced through holes and wherein gas pressure is utilized at a location surrounding a string to counter-balance the gravitational pressure induced head of the melt, thereby to prevent leakage.

12. The method of claim 1 wherein the melt is confined in a crucible having holes in the bottom thereof, wherein a string enters the melt through a hole in the bottom of the crucible, wherein a current is passed through the melt near the string entry point to the bottom of the crucible and wherein a magnetic field is applied substantially perpendicular to the direction of the current, with both the current and the magnetic field being applied such that the induced electromagnetic forces in the melt act to balance the gravitational forces acting on the melt, thereby to prevent leakage.

13. The method of claim 1 wherein the melt depth through which the string passes is minimized, thereby minimizing the introduction of impurities from the string to the melt.

14. Apparatus for continuously growing crystalline or semicrystalline ribbonlike bodies from a melt of the same material wherein the ribbonlike body has a flat unobstructed elongate center section grown directly from the melt surface comprising:
   means for containing a melt; and,
   means including spaced apart strings for drawing the ribbonlike body from the surface of the melt, said strings serving to stabilize the edge positions of the ribbonlike body by forming the edges thereof, said strings being frozen into the growing ribbon.

15. The apparatus of claim 14 wherein said strings are of a material different from that of the melt.

16. The apparatus of claim 14 further including means for moving the strings through the melt at substantially the same speed as the growth rate of the ribbon.

17. The apparatus of claim 14 wherein the strings act to define the edges of the meniscus during ribbon growth.

18. The apparatus of claim 14 wherein the strings are wetted by the melt.

19. The apparatus of claim 14 and further including means for pulling the ribbon in a direction perpendicular to the melt surface.

20. The apparatus of claim 14 and further including means for pulling ribbon at an angle to the melt other than perpendicular.

21. The apparatus of claim 14 wherein said containing means includes an open top crucible to confine said melt, and further including means for introducing said strings into the melt through its upper surface, said last mentioned means including a submerged pulley and means for feeding said strings around said submerged pulley so that the strings emerge from the melt at the upper surface.

22. The apparatus of claim 14 wherein said containing means includes a crucible to confine said melt, said crucible having holes in the bottom thereof, and further including means for introducing said strings to the melt through said holes, with surface tension forces acting to maintain the melt from leaking out.

23. The apparatus of claim 14 wherein said containing means includes a crucible to confine said melt, said crucible having holes in the bottom thereof, and further including means for introducing said strings through said holes, and means for applying gas pressure at a location surrounding a string to counter-balance the gravitational pressure induced head of the melt, thereby to prevent leakage.

24. The apparatus of claim 14 wherein said containing means includes a crucible to confine said melt, said crucible having holes in the bottom thereof, and further including means for introducing a string through a hole in the bottom of said crucible, means for passing a current through the melt near the string entry point to the bottom of the crucible, and means for applying a magnetic field substantially perpendicular to the direction of the current, with both the current and the magnetic field being applied such that the induced electromagnetic forces in the melt act to balance the gravitational forces acting on the melt, thereby to prevent leakage.

25. Apparatus for minimizing the introduction of impurities from a melt into a ribbon grown from the melt at an interface which lies between the edges of the ribbon in the plane of the growing ribbon, comprising means including melt containing means for constantly flowing the melt at said interface in a direction substantially perpendicular to the plane of the ribbon grown, thereby to remove the impurities that build up by the segregation of impurities at the growth interface.

26. Apparatus of claim 25 and further including means for inducing flow by electromagnetic stirring.

* * * * *